(12) United States Patent
Tsuda

(10) Patent No.: US 8,264,128 B2
(45) Date of Patent: Sep. 11, 2012

(54) PIEZOELECTRIC COMPONENT AND MANUFACTURING METHOD THEREOF

(75) Inventor: Toshimasa Tsuda, Saitama (JP)

(73) Assignee: Nihon Dempa Kogyo Co., Ltd., Tokyo (JP)

( * ) Notice: Subject to any disclaimer, the term of this patent is extended or adjusted under 35 U.S.C. 154(b) by 268 days.

(21) Appl. No.: 12/800,675

(22) Filed: May 20, 2010

(65) Prior Publication Data

US 2010/0301708 A1   Dec. 2, 2010

(30) Foreign Application Priority Data

May 26, 2009   (JP) .................. 2009-125937
Dec. 17, 2009  (JP) .................. 2009-285878
Apr. 26, 2010  (JP) .................. 2010-100903

(51) Int. Cl.
H01L 41/09   (2006.01)
H01L 41/22   (2006.01)

(52) U.S. Cl. ............ 310/348; 310/349; 29/25.35

(58) Field of Classification Search ............ 310/348, 310/349; 29/25.35
See application file for complete search history.

(56) References Cited

U.S. PATENT DOCUMENTS

2011/0043078 A1 *  2/2011  Tsuda ................. 310/364

FOREIGN PATENT DOCUMENTS

JP   2006-108993   4/2006
JP   2006-197554   7/2006

* cited by examiner

*Primary Examiner* — Thomas Dougherty
(74) *Attorney, Agent, or Firm* — Scott D. Wofsy; Edwards Wildman Palmer LLP

(57) ABSTRACT

An object of the present invention is to economically manufacture a piezoelectric component having superior molding pressure resistance and reduced height. The present invention comprising: a piezoelectric substrate with piezoelectric devices formed on a principle surface; a device wiring section formed on the principle surface; protective film having a terminal electrode connected to the wiring section formed on its upper surface; a rewiring layer on an upper surface of the protective film and connected to a wiring section of another electrode; an inorganic material-buffer layer covers an entire upper surface of the rewiring layer excluding the piezoelectric devices; a photosensitive film-outer periphery wall, formed on an upper surface of the buffer layer; a photosensitive film-first ceiling layer, having mica filler added thereto is formed on an upper surface of the outer periphery wall; an insulating material mesh-shaped member, installed on an upper surface of the first ceiling layer; a photosensitive resin film-second ceiling layer with mica filler added thereto covers an upper surface of the mesh-shaped member; and through electrodes that pass through the first and second ceiling layers, the outer periphery wall, and the mesh-shaped member, thus between the outer periphery wall, the first ceiling layer, and the principle surface of the piezoelectric substrate, there is a hollow that accommodates the piezoelectric devices.

20 Claims, 5 Drawing Sheets

(a)

(b)

(c)

PIEZOELECTRIC COMPONENT AND MANUFACTURING METHOD THEREOF

BACKGROUND ART

The present invention relates to a piezoelectric component, such as a surface acoustic wave (SAW) device and a piezoelectric thin film filter used in a SAW duplexer and SAW filter, to be used in mobile communication devices such as a mobile phone. In particular, the invention relates to a piezoelectric component in which a piezoelectric device is on a wafer at a wafer-level, is packaged in a chip size, and a mesh-shaped member is seal-enclosed in a ceiling layer that constitutes a hollow section, and molding pressure resistance of the hollow section is improved by using a photosensitive resin film having a mica filer added thereto.

In a piezoelectric component (SAW device) equipped on a mobile phone, it is necessary to ensure a space, within which electrodes are oscillated due to a piezoelectric effect, by providing a predetermined hollow section around a comb electrode section (Interdigital Transducer Section herein after called as "IDT"). Conventionally, in order reduce the size of a SAW device, a SAW device chip is flip-chip bonded (face-down bonded) on a wiring substrate with use of a gold (Au) bump or solder bump, and the entirety of the SAW device chip is sealed with a resin or the like, to thereby configure a small size package device of a SAW device.

Furthermore, there has been proposed a microminiaturized chip-size package SAW device in which, in order to reduce the size and height of a SAW device, a predetermined hollow section is formed around comb electrode sections, the entirety of an aggregate piezoelectric substrate (wafer) on the comb electrodes side is sealed with a resin while retaining this hollow section, and having formed external connection electrodes, it is divided, by means of dicing, into individual SAW devices.

For example, in the SAW device disclosed in Patent Document 1 (Japanese Unexamined Patent Publication No. 2006-108993), a clearance (hollow section) formation layer (outer periphery wall) composed of a photosensitive resin is formed on the upper surface of a SAW chip (piezoelectric substrate), on which comb electrodes are formed, and a sealing layer (ceiling section) is laminated and sealed on this clearance formation layer, to thereby form a clearance (hollow section) around the comb electrodes.

Moreover, in the SAW device disclosed in Patent Document 2 (Japanese Unexamined Patent Publication No. 2006-197554), a cover having through electrodes is joined and sealed via a metallic joint section so as to face the SAW chip (piezoelectric substrate) having comb electrodes formed thereon, and a hollow section is formed between the SAW chip and the cover to accommodate the comb electrodes.

However, when mounting this type of a piezoelectric component on a mount substrate and modularizing it on site by means of transfer molding, normally, a pressure ranging from 5 MPa to 15 MPa is applied. Consequently, in a case where the clearance (hollow section) formation layer and the sealing layer of the SAW device disclosed in Patent Document 1 (Japanese Unexamined Patent Publication No. 2006-108993) are configured only with organic materials, there is a possibility that the hollow section that accommodates the comb electrodes therein may be contracted and the electrical characteristic of the comb electrodes may consequently be deteriorated in some cases when resin-sealing by means of transfer molding or the like, unless the thickness of the sealing resin layer that constitutes the ceiling section is increased or is configured with a hard material. However, it is extremely difficult to increase the thickness of the sealing resin layer, and configure the sealing resin layer with a hard material to thereby achieve molding pressure resistance, only with the photosensitive resin material used for this type of resin sealing.

Moreover, in the SAW device disclosed in Patent Document 2 (Japanese Unexamined Patent Publication No. 2006-197554), separate electrodes are required for forming through holes, in which through electrodes are to be provided, in a cover, and for joining and laminating a SAW chip (piezoelectric substrate) and the cover (substrate). Also there is a possibility that the substrates may be bent when laminating the substrates in some cases. Moreover there is a possibility that the cost of manufacturing piezoelectric components may increase in some cases as a result of laminating substrates (wafers) composed of the same material (piezoelectric substrate). Furthermore, in order to achieve reduction in the height of a piezoelectric component, the substrate (wafer) needs to be made thin. However, this has been extremely difficult to achieve.

DISCLOSURE OF THE INVENTION

In order to solve the above problems, in the present invention, a mesh-shaped member composed of an insulating material is seal-enclosed within a ceiling layer that forms a hollow section, in which comb electrodes are sealed, and further, a mica filler is added to a photosensitive resin that constitutes the ceiling layer, to thereby manufacture, at a low cost, a piezoelectric component that has a superior level of molding pressure resistance while reducing the height thereof.

Consequently, a piezoelectric component of the present invention comprises: a piezoelectric substrate; a piezoelectric device formed on the principle surface of the piezoelectric substrate; a wiring section connected to the piezoelectric device formed on the principle surface of the piezoelectric substrate; a protective film that has an electrode connected to the wiring section and is formed on an upper surface of the wiring section; a rewiring layer that is formed on an upper surface of the protective film and that is connected to the wiring section of an electrode, which is different from the electrode; a buffer layer that is composed of an inorganic material or an organic material and that covers the entire upper surface of the rewiring layer excluding the piezoelectric device and terminal electrode section; an outer periphery wall layer that is composed of a photosensitive resin and is formed on an upper surface of the buffer layer; a first ceiling layer that is composed of a photosensitive resin and is formed on an upper surface of the outer periphery wall layer; a mesh-shaped member that is composed of an insulating material and is installed on an upper surface of the first ceiling layer; a second ceiling layer that is composed of a photosensitive resin film and is formed so as to cover an upper surface of the mesh-shaped member; and a through electrode that is formed so as to pass through the first ceiling layer, the second ceiling layer, the outer periphery wall layer, and the mesh-shaped member, wherein between the outer periphery wall layer, the first ceiling layer, and the principle surface of the piezoelectric substrate, there is formed a hollow section that accommodates the piezoelectric device.

Moreover, in the present invention, the outer periphery wall layer is formed, by means of photolithography, with a photosensitive resin having an elastic modulus of preferably 3 GPa or less. Furthermore, both or either one of the first ceiling layer and the second ceiling layer are formed with a photosensitive resin film in which 10 to 45% by weight of a mica filler is added to a photosensitive resin.

Furthermore, in the present invention, the outer periphery wall layer is formed, by means of photolithography, with a photosensitive resin having an elastic modulus of preferably 3 GPa or less. Furthermore, both or either one of the first ceiling layer and the second ceiling layer are formed with a photosensitive resin film in which 10 to 45% by weight of a mica filler is added to a photosensitive resin and the elasticity thereof is 5 GPa or greater.

Moreover, in the present invention, the outer periphery wall layer is formed by means of photolithography with a photosensitive resin, the first ceiling layer is further formed, the upper surface thereof is covered with the mesh-shaped member, and there is further formed the second ceiling layer that covers the upper surface of the mesh-shaped member and that is composed of a photosensitive resin film with an elastic modulus of 5 GPa or greater containing a mica filler.

Moreover, in the present invention, the mesh-shaped member is formed with an inorganic material such as quartz glass and carbon fiber, or with an organic material, and it is sealed within the ceiling layer.

The lattice size of the fiber of the mesh-shaped member of the present invention may be either greater than or smaller than the diameter of the through electrode. Moreover, in a case where the lattice size is smaller than the diameter of the through electrode, part of the mesh lattice may pass through the through electrodes formed by means of plating.

Moreover, having sealed the mesh-shaped member between the first ceiling layer and the second ceiling layer and then removing the resin layer by means of photolithography to form the through electrode, the mesh-shaped member may be removed by means of wet or dry etching with use of laser light (YAG, CO2, excimer laser, and the like) or with use of the photosensitive resin as a mask.

Furthermore, the structure of the electrode of the present invention is such that other electrodes such as solder balls may be used, by changing the shape of another outer periphery wall section, the first ceiling layer, the mesh-shaped member, and the second ceiling layer.

Consequently, it is possible to manufacture at a low cost a piezoelectric component that has a superior level of molding pressure resistance and that has a reduced height thereof, without increasing the thickness of the component or obstructing the electrode forming process.

DETAILED DESCRIPTION OF PREFERRED EMBODIMENT

Hereunder, an embodiment of a piezoelectric component and a manufacturing method thereof of the present invention are described in detail.

Piezoelectric Component (SAW Device)

Figure 1:
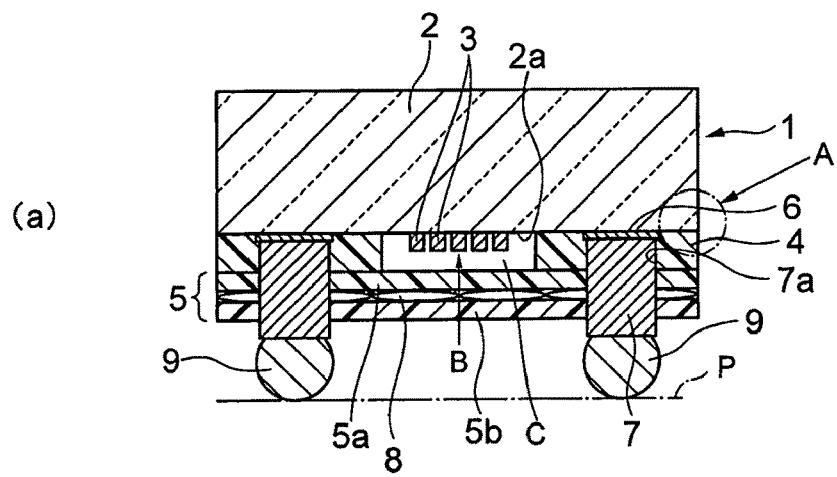
FIG. 1(a) is a longitudinal sectional view of a SAW device according to an embodiment of a piezoelectric component of the present invention.
FIG. 1(b) is a plan view schematically showing comb electrodes on the principle surface of a piezoelectric substrate seen from the direction of arrow B illustrated in FIG. 1(a)
FIG. 1(c) is a drawing, on an enlarged scale, of a portion illustrated with arrow A in FIG. 1(a).
Figure 1:
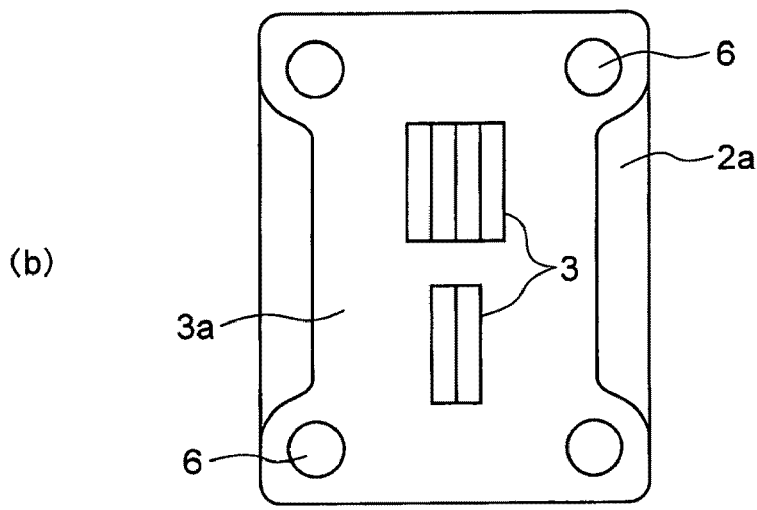
Figure 1:
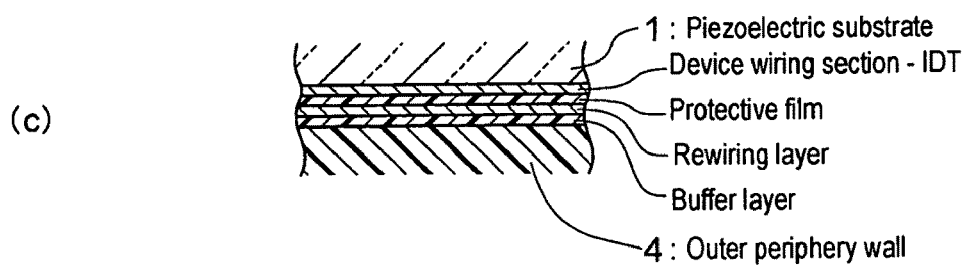

FIG. 1 is a longitudinal sectional view of a SAW device, which is an embodiment of a piezoelectric component of the present invention.

As shown in FIG. 1, a SAW device 1 of the embodiment of the piezoelectric component of the present invention comprises: a piezoelectric substrate 2 in which a ceramic material or crystalline material (for example, sapphire) is laminated on a piezoelectric substrate composed of lithium tantalate ($LiTaO_3$), lithium niobate ($LiNbO_3$), crystal, or the like, or on a substrate having a piezoelectric function that is formed the substrate, or on these piezoelectric substrates; comb electrodes 3 (piezoelectric devices) formed on a principle surface 2a of the piezoelectric substrate 2; an outer periphery wall 4 that forms a clearance (hollow section) C above the comb electrodes 3; a ceiling section 5 that is laminated on the upper surface of the outer periphery wall 4; terminal electrodes 6 formed on the principle surface 2a of the piezoelectric substrate 2; and column-shaped through electrodes 7 formed on these terminal electrodes 6 by means of electrolytic plating so as to pass through the ceiling section 5 and the outer periphery wall 4. And, as necessary, on the lower end section of these through electrodes 7 there are fixed solder ball electrodes 9, and flux is supplied therearound, thereby connecting the solder ball electrodes 9 respectively to external wiring electrodes (not shown in the drawing) of a mount substrate P (printed substrate). Here, the reason for the solder ball electrodes 9 being fixed on the lower end section of the through electrodes 7 is such that since it is extremely difficult to perform an operation of connecting them to the mount substrate P if the pitch between the through electrodes 7 is as narrow as approximately 200µ for example, when performing an operation of mounting on a printed substrate on site for modularizing a semiconductor device, solder balls of a diameter of approximately 150µ are preliminarily fixed on the lower end section of the through electrodes, to thereby configure the solder ball electrodes 9. In those cases where the through electrodes 7 can be directly connected to the mount substrate P using soldering paste, the solder ball electrodes 9 do not have to be fixed. Here, the hollow section C is formed between the outer periphery wall 4, the ceiling section 5, and the principle surface 2a of the piezoelectric substrate 2.

Moreover, the comb electrodes 3 are electrically connected, via device wirings 3 of the wiring electrodes and the terminal electrodes 6, to the through electrodes 7 and the solder ball electrodes 9. Here, the comb electrodes 3 and the wiring electrodes constitute the piezoelectric device. Moreover, as the piezoelectric device, in addition to a surface acoustic wave (SAW) device and a FBAR (film bulk acoustic resonator), there may be applied a device manufactured with MEMS (Micro Electro Mechanical Systems).

Furthermore, the device wirings of the wiring electrodes and the like are configured with wirings that are composed of: a material containing any one of Al, Cu, Au, Cr, Ru, Ni, Ti, W, V, Ta, Mo, Ag, In, and Su serving as the primary component thereof; a compound of these materials, and oxygen, nitrogen, or silicon; an alloy of these materials; an intermetallic compound; or a multiple-layered lamination of these. Moreover, a plurality of the device wirings are formed on the principle surface of the piezoelectric substrate, and all of the device wirings are arranged so as to have an equal electrical potential.

In particular, in the SAW device 1 of the embodiment of a piezoelectric component of the present invention, a mesh-shaped member 8 composed of an insulating material is sealed inside the ceiling section 5 in order to ensure a sufficient level of tolerance to high pressures (for example, from 5 MPa to 15 MPa) to be applied on the SAW device when performing transfer molding (resin sealing) on the mount substrate of the SAW device on site, and also to prevent the hollow section from being contracted and the electrical characteristic of the comb electrodes 3 from being consequently impaired.

That is to say, this mesh-shaped member 8 is composed of an inorganic material such as quartz glass, which has a high level of tensile strength, carbon fiber, and aramid fiber (for example, nonconductive carbon fiber: KEVLAR (registered trademark of Du Pont)) or of an organic material. Having formed a first layer 5a of the ceiling section 5 by laminating a photosensitive resin film on the upper surface of the outer periphery wall 4, the mesh-shaped material 8 (for example, a glass cloth having a predetermined mesh (lattice size)) is installed on the upper surface of this photosensitive resin film, and a second ceiling layer 5b is formed on this mesh-shaped material 8 by laminating a photosensitive resin film in a similar manner. Here, the size of the dimension (mesh) of the mesh (lattice) formed in the mesh-shaped material 8 may be greater than the diameter of the through electrodes 7 grown on the terminal electrodes 6 by means of electrolytic plating, so that the through electrodes 7 are formed so as to pass through the mesh of the mesh-shaped material 8 from the lower side.

Here, a sufficient elastic modulus can be obtained in those cases where the ceiling section 5 is formed with a photosensitive resin film with a mica filler added thereto, and therefore the mesh-shaped member 8 does not have to be installed, and the ceiling section 5 can be made in a single layer structure.

Here, to describe the lamination configuration of the piezoelectric component of the present invention in detail, as shown in FIG. 1(c): first, an insulation layer (protective film) is formed on the piezoelectric device (including the wiring electrode) formed on the principle surface of the piezoelectric substrate; a rewiring layer prepared to connect to the wiring section of another electrode is formed on this insulation layer; further, a buffer layer composed of an inorganic material is formed on the upper surface of this rewiring layer so as to cover the entire surface excluding the piezoelectric device; an outer periphery wall layer composed of a photosensitive resin film is formed on this buffer layer; further, the first layer of the ceiling section is formed with a photosensitive resin (film) on this outer periphery wall layer to thereby form the hollow section C, in which the piezoelectric device is accommodated; the mesh-shaped member composed of an insulating material is installed on this first layer of the ceiling section; and further, the second layer of the ceiling section is formed on the upper surface of this mesh-shaped member by laminating a photosensitive resin film. A protective layer may be interposed between the bottom surface of the outer periphery wall layer and the principle surface of the piezoelectric substrate.

Moreover, when forming the insulation layer on the piezoelectric device (wiring section), an insulating material may be formed as a foundation on the piezoelectric device, and an insulation film composed of an organic material may be formed on the upper surface of this foundation. Furthermore, an insulation film composed of an organic material may be formed on the upper surface of the piezoelectric device (wiring section), and an insulation film composed of an inorganic material having a thickness not less than 2,000 angstroms may be further formed on the upper surface of this insulation film. Here, the above inorganic material that constitutes this insulation film is formed with a photosensitive material having a permittivity (dielectric constant) of not more than 3.5, in order to efficiently perform mutual electromechanical exchange between electric signals and surface waves. In general, $SiO_2$ is used as the above inorganic material, however, a material such as polyimide, SOG and BCB may be used (here, CYCLOTEN, trademark of Dow Chemical Co. may be considered in relation to BCB).

Moreover, on the outer surface of the ceiling layer and the outer periphery wall layer that form the hollow section C, there may be formed a film that is composed of an insulating material made with an organic material such as photosensitive polyimide or quartz glass or the like containing $SiO_2$, or that is composed of an insulating material such as a metal oxide film. Thereby, the degree of adhesion of the outer periphery wall layer on the piezoelectric substrate is improved, and moreover, stress concentration is mitigated.

Furthermore, according to the molding pressure resistance evaluation conducted by the present inventors, an elastic modulus of approximately 5 GPa can be ensured with the mesh-shaped member 8 configured with an inorganic fiber material such as quart glass, and moreover, if the amount of quartz glass and the like to be added is increased, that is to say, if a greater amount of quartz glass fiber is added, an elastic modulus of approximately twice the usual elastic modulus can be ensured. Moreover, the elastic modulus of the photosensitive resin film at the molding temperature (approximately 150° C.) can be improved by changing the photosensitive curing agent (by increasing the glass transition temperature) (refer to FIG. 2).

However, if the amount of mesh-shaped member 8 to be installed within the ceiling section 5 becomes great, molding of the ceiling section 5 becomes difficult, and the hollow section C may be contracted in the portion of the ceiling section 5 where the mesh-shaped member 8 is absent in some cases, due to insufficient molding pressure resistance.

Consequently, in the present invention, in addition to the mesh-shaped member 8 composed of quartz glass or the like, 10 to 45% by weight of the photosensitive resin material of a filler [average grain diameter 20 to 50 um (1 to 100 um), average aspect ratio (ratio between the width and the height) 50 to 100] composed of mica is added to the photosensitive resin material that forms the ceiling section 5, and the photosensitive resin film is formed in which, when the formation is performed, the mica filler is highly oriented so as to be oriented in the same direction with respect to the surface of the photosensitive resin film. In particular, mica fillers have a high aspect ratio of for example 90, are thin, have a high level of strength, and can be obtained at a low price (less expensive than fillers composed of $SiO_2$ and the like).

Figure 2:
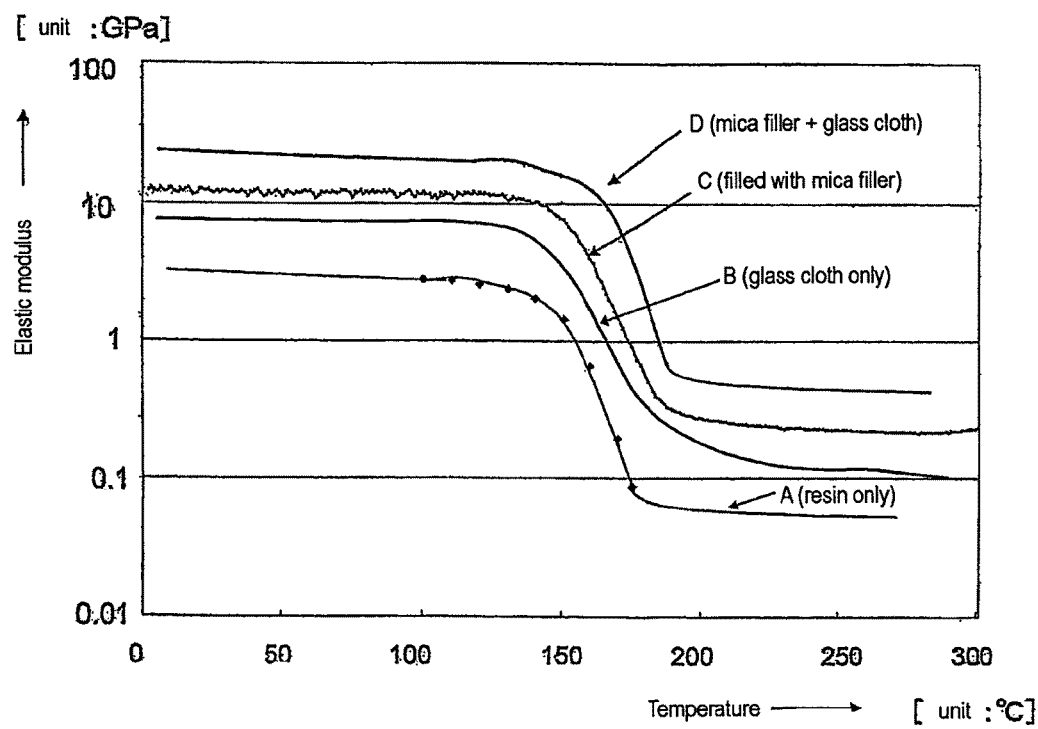
FIG. 2 is a graph showing elastic modulus in predetermined temperature ranges (across normal temperature, molding temperature, glass transition temperature, and reflowing temperature) in respective cases: where a photosensitive resin film only has a resin (curve A); where only a glass cloth (mesh-shaped member) is mounted (curve B); where a mica filler is filled in the photosensitive resin film (curve C); and where a mica filler is filled in the photosensitive resin film and a glass cloth is mounted (curve D).

The present inventors have verified that by adding this mica filler to the photosensitive resin film, an elastic modulus of approximately 5 GPa at room temperature that can be obtained with the mesh-shaped member 8 composed of quartz glass and the like, can be improved to approximately 12 GPa (refer to FIG. 2).

Here, both of the first ceiling layer 5a and the second ceiling layer 5b that constitute the ceiling section 5, or either one of them, may be formed with aforementioned the photosensitive resin film having the mica filler added thereto.

Moreover, by changing the curing agent of the photosensitive resin (by changing the composition of the material so as to increase Tg, i.e. with the curing material as an example, in this case, the primary material, curing material and other materials to be added are changed so that Tg of the resin is increased), the composition of the photosensitive resin can be changed and thereby the elastic modulus thereof can be increased. Moreover, it is favorable, in terms of increasing the molding pressure resistance, to increase the glass transition temperature to a temperature greater than or equal to the molding temperature, and for example, by changing components, the elastic modulus can be highly increased from 2 GPa to 2.8 GPa, and the glass transition temperature (Tg) can be increased, for example, from 178° C. to 194° C. (refer to FIG. 2). Furthermore, by adding a mica filler and a meshed reinforcing material, it is possible to realize a photosensitive material with a high level of strength, realization of which has been conventionally difficult, and as a result, pressure resistance strength is improved in a process such as transfer molding, in which a high level of strength is required under high temperature and high pressure.

Piezoelectric Component Manufacturing Method

Figure 3:
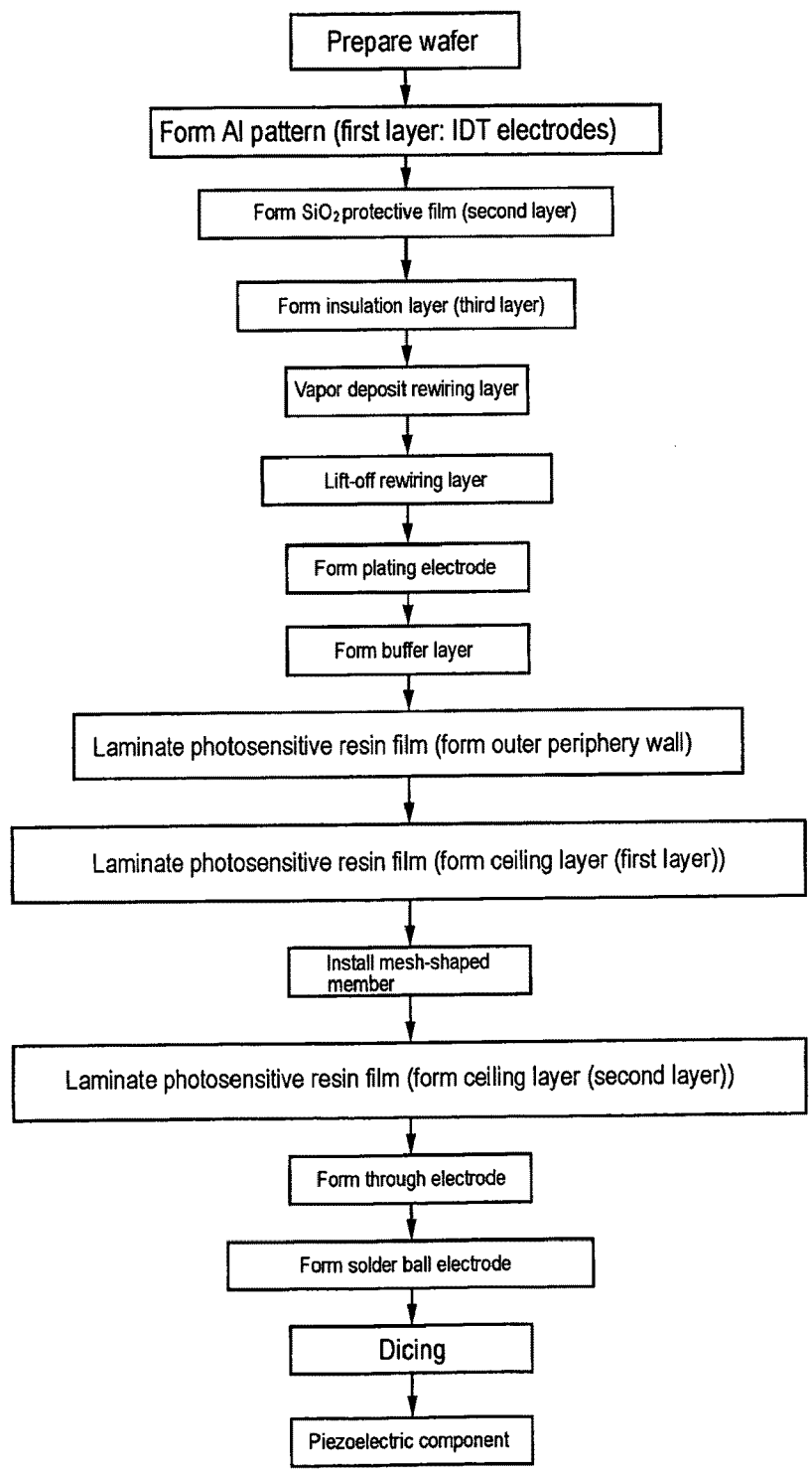
FIG. 3 is a schematic process flow diagram of an embodiment of a manufacturing method of a piezoelectric component of the present invention.
Figure 4:
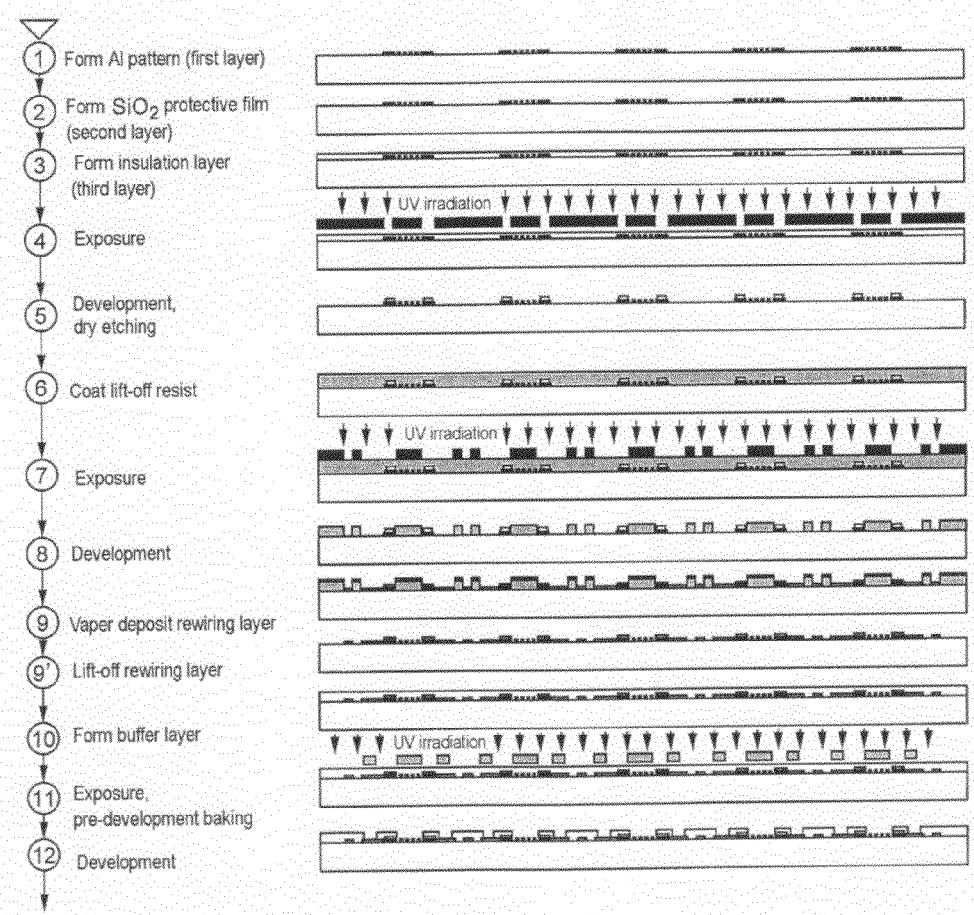
FIG. 4 is a detailed process flow diagram of the embodiment of the manufacturing method of a piezoelectric component of the present invention (from step (1) to step (12)).
Figure 5:
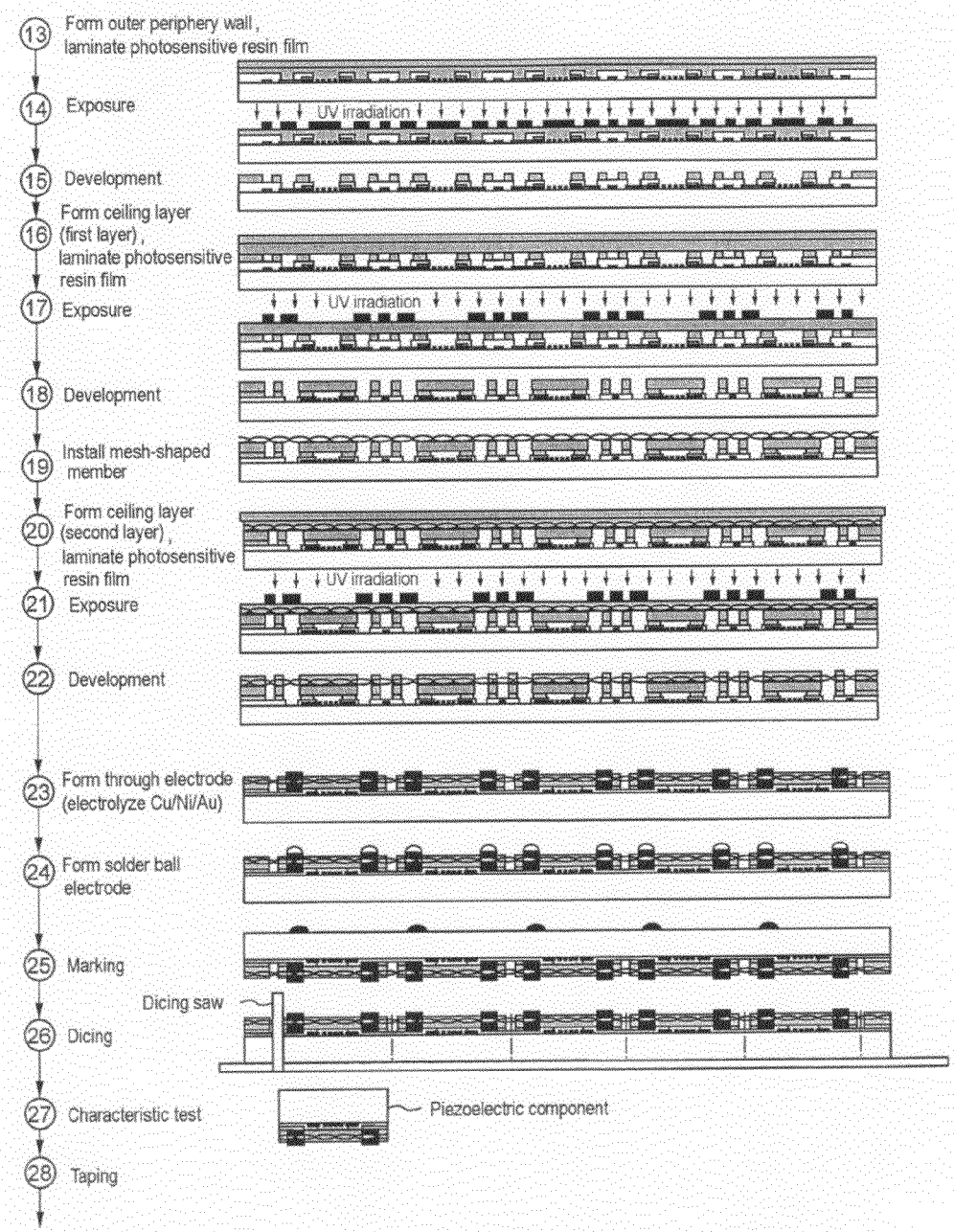
FIG. 5 is a detailed process flow diagram of the embodiment of the manufacturing method of a piezoelectric component of the present invention (from step (13) to step (28)).

Next, there is described, with reference to FIG. 3 to FIG. 5, a piezoelectric component manufacturing method of the present invention, with regard to a SAW device manufacturing method, which is an embodiment thereof.

First, as shown in FIG. 3 and FIG. 4, an aggregate piezoelectric substrate (wafer) composed of $LiTaO_3$, $LiNbO_3$, quartz, or the like is prepared. Then and in step (1), respectively corresponding comb electrodes (IDT) and wiring electrodes to be connected thereto are formed with a predetermined thickness (for example, 2,000 to 4,000 angstroms) on the principle surface of the aggregate piezoelectric substrate (piezoelectric substrate that becomes individual (7,000 pieces for example) piezoelectric components (SAW devices) that form individual pieces after being cut), with use of a technique of sputtering or vapor depositing a conductive film having a metallic material composed of Al and the like serving as the primary component thereof. Then unwanted metallic films and residual resist are removed by means of photolithography, to thereby form the comb electrode and wiring electrode (hereunder, referred to as "piezoelectric device") (first layer).

Next, in step (2), on the surface of the piezoelectric devices, there is formed a protective film composed of an inorganic material such as $SiO_2$ or an organic material (second layer). When forming the protective film composed of $SiO_2$ on the upper surface of the piezoelectric device, first, an $SiO_2$ film is formed on the piezoelectric devices. Then a resist composed of a photosensitive resin is coated on the entire piezoelectric substrate, and then the $SiO_2$ film is formed by means of photolithography or dry etching with use of a $CF_4$ gas or the like.

Here, in the embodiment of the piezoelectric component manufacturing method of the present invention, a photosensitive resist is preliminarily coated on the upper surface of the piezoelectric devices. Then a pattern is formed by means of photolithography, and then an inorganic material such as $SiO_2$ is sputtered, to thereby form the $SiO_2$ film on the surface of the piezoelectric device. Furthermore, it is possible to remove the resist by means of a liftoff technique with use of a solvent, to thereby have the $SiO_2$ protective film only remaining in the required portion on the upper surface of the piezoelectric device.

Furthermore, in order to form an insulation layer (third layer) in step (3) to step (5), having coated an insulation layer on the entire surface of the piezoelectric substrate, a photolithography process including exposure (UV irradiation) and development, and dry etching are performed to thereby form the insulation layer (third layer).

Subsequently, in step (6) to step (8), having coated a liftoff photoresist on the upper surface of this insulation layer (third layer) and performed a photolithography process including exposure (UV irradiation) and development, to thereby form a rewiring layer.

Furthermore, in steps (9, 9'), Cr/Cu is vapor-deposited on the rewiring layer, and then the liftoff resist is lifted off to remove unwanted portions, to thereby prepare the rewiring layer to be electrically connected to the electrode other than the wiring electrode of the piezoelectric device.

Moreover, in steps (10) to (12), having coated a photosensitive resist on the upper surface of the rewiring layer and performed a photolithography process including exposure (UV irradiation), pre-development baking, and development, a post development curing process is performed, to thereby form a buffer layer with a thickness of 100 to 500 angstroms that is composed of an inorganic material and is to cover the piezoelectric devices.

Furthermore, having exposed the wiring electrode which has been formed on the principle surface of the piezoelectric substrate, by means of dry etching, a plating electrode is formed on the principle surface of the piezoelectric substrate with a metallic material such as Cu/Al or Cr/Cu.

Next, in steps (13) to (15), from the upper surface of the buffer layer composed of an inorganic material that is formed in the steps (10) to (12) above, a photosensitive resin film is heat-pressed and thereby laminated on the principle surface of the piezoelectric substrate with use of a heat-pressing roller, and then a photolithography process including exposure (UV irradiation), development, and post-development curing, is performed to thereby form an outer periphery wall layer having a predetermined shape.

In steps (16) to (18), a ceiling section (first layer) to be laminated on the upper surface of the outer periphery wall layer formed earlier, is formed in a manner such that a photosensitive resin film (thickness: 15 to 30 μm) having a mica filler added thereto is heat-pressed and laminated with use of a heat-pressing roller, and a photolithography process including exposure (UV irradiation), development, and post-development curing is performed. At this time, on the ceiling section (first layer), on the surface corresponding to the terminal electrode formed on the piezoelectric substrate, there are formed, for example, four through holes 7a for through electrodes.

Next, in step (19), a mesh-shaped member is installed on the upper surface of this ceiling section (first layer).

This mesh-shaped member, as described above, is composed of quartz glass, carbon fiber (non-conductive carbon fiber), or the like having a high level of pressure resistance strength, and glass cloth with a fiber string diameter of 10 to 20 μm and a mesh (lattice) size (mesh) of 30 to 100 μm is particularly suitable therefor.

Furthermore, in steps (20) to (22), a photosensitive resin film having a mica filler added thereto is heat-pressed, laminated and sealed on the upper surface of the mesh-shaped member installed on the upper surface of the ceiling section (first layer) with use of a heat-pressing roller, and then a photolithography process including exposure (UV irradiation), development, and post-development curing is performed to thereby form a ceiling section (second layer). Here, as with the case of the ceiling section (first layer), through holes 7a for through electrodes are formed in predetermined positions on the ceiling section (second layer).

Furthermore, in step (23), having zincate-treated the Cu electrodes (plating electrodes) formed earlier, through electrodes 7 are formed in the through holes 7a, which were formed in the ceiling section 5 earlier, by means of Cu/Ni/Au electrolytic plating. These through electrodes (post electrodes) 7 are grown and formed so as to extend along the axial direction of the through holes 7a. Here, the lattice size (mesh) of the mesh-shaped member 8 having being sealed within the ceiling section 5 will not obstruct formation of the through electrodes 7 performed by means of plating (plating fluid travels through the mesh), and therefore the size of the electrodes and the lattice size of the mesh do not become a problem in particular. When the lattice size of the mesh-shaped member becomes a problem, it is possible to perform removal by (i) performing trimming with a laser and (ii) using the photosensitive materials (first and second ceiling sections) as a mask, by means of (a) wet etching or (b) dry etching.

The mesh portion of the mesh-shaped member does not obstruct formation of the through electrodes 7 with the plating fluid in any way, and moreover, the through electrodes 7 are grown so as to pass through the mesh of the mesh-shaped member 8 without being obstructed and to be embedded within the through electrodes. Moreover, a mica filler is added to the photosensitive resin film that constitutes the ceiling section, and it is consequently possible to significantly increase the strength (elastic modulus) of the ceiling section 5 while reducing the height of the piezoelectric component (SAW device).

Next, in step (24), solder balls of a diameter 150µ are soldered on the lower end section of the through electrodes 7, thereby forming the solder ball electrodes 9.

A marking process is performed in step (25), and then finally, in step (26), a completed aggregate piezoelectric substrate (wafer) is dicing-cut into individual pieces (7,000 pieces, for example) using a dicing saw, to thereby manufacture individual piezoelectric components (SAW devices).

Then, having conducted a characteristic inspection [step (27)] and taping [step (28)], the piezoelectric components are shipped.

What is claimed is:

1. A piezoelectric component comprising:
   a piezoelectric substrate;
   a piezoelectric device formed on a principle surface of said piezoelectric substrate;
   a device wiring section formed on a principle surface of said piezoelectric substrate;
   a protective film that has a terminal electrode connected to the wiring section and is formed on an upper surface of said wiring section;
   a rewiring layer that is formed on an upper surface of the protective film and that is connected to a wiring section of an electrode, which is different from said electrode;
   a buffer layer that is composed of an inorganic material and that covers the entire upper surface of the rewiring layer excluding said piezoelectric device;
   an outer periphery wall layer that is composed of a photosensitive resin and is formed on the upper surface of the buffer layer;
   a first ceiling layer that is composed of a photosensitive resin film and is formed on an upper surface of the outer periphery wall layer;
   a mesh-shaped member that is composed of an insulating material and is installed on an upper surface of the first ceiling layer;
   a second ceiling layer that is composed of a photosensitive resin film and is formed so as to cover an upper surface of the mesh-shaped member; and
   a through electrode that is formed so as to pass through said first ceiling layer, said second ceiling layer, said outer periphery wall layer, and said mesh-shaped member, wherein between said outer periphery wall layer, said first ceiling layer, and a principle surface of said piezoelectric substrate, there is formed a hollow section that accommodates said piezoelectric device.

2. A piezoelectric component according to claim 1, wherein said outer periphery wall layer is formed by means of photolithography with a photosensitive resin film, and furthermore, both or either one of said first ceiling layer and said second ceiling layer are formed with a photosensitive resin film in which 10 to 45% by weight of a mica filler is added to a photosensitive resin.

3. A piezoelectric component according to claim 1, wherein said outer periphery wall layer is formed by means of photolithography with a photosensitive resin film, and furthermore, both or either one of said first ceiling layer and said second ceiling layer are formed with a photosensitive resin film in which 10 to 45% by weight of a mica filler is added to a photosensitive resin and an elastic modulus thereof is 5 GPa or greater.

4. A piezoelectric component according to claim 1, wherein said outer periphery wall layer is formed by means of photolithography with a photosensitive resin film, said first ceiling layer is further formed with a photosensitive resin film, an upper surface thereof is covered with said mesh-shaped member, and there is further formed said second ceiling layer that covers an upper surface of said mesh-shaped member and that is composed of a photosensitive resin film with an elastic modulus of 5 GPa or greater containing a mica filler.

5. A piezoelectric component according to claim 1, wherein said mesh-shaped member is formed with an inorganic material such as quartz glass and carbon fiber, or with an organic material.

6. A piezoelectric component according to claim 1, wherein said mesh-shaped member is sealed within said ceiling layer.

7. A piezoelectric component according to claim 1, wherein a dimension of a mesh of said mesh-shaped member is greater than a diameter of said through electrode.

8. A piezoelectric component according to claim 1, wherein said protective film formed on an upper surface of said wiring section includes a foundation film composed of an insulating material, and an insulation film formed on an upper surface of the foundation film.

9. A piezoelectric component according to claim 1, wherein said protective layer formed on an upper surface of said wiring section includes an insulation film that is composed of an organic material and is formed on an upper surface of said wiring section, and further includes an insulation film that is composed of an inorganic material of a thickness of 2,000 angstroms or greater and is formed on an upper surface of the insulation film.

10. A piezoelectric component according to claim 9, wherein said insulation film composed of an inorganic material is formed with a photosensitive material having a permittivity of not more than 3.5.

11. A piezoelectric component according to claim 1, wherein said piezoelectric device is a surface acoustic wave device, a FBAR or a device manufactured with MEMS.

12. A piezoelectric component according to claim 1, wherein said device wiring section is configured with wiring that are composed of: a material containing any one of Al, Cu, Au, Cr, Ru, Ni, Ti, W, V, Ta, Mo, Ag, In, and Su serving as a primary component thereof; a compound of these materials and oxygen, nitrogen, or silicon; an alloy of these materials; an intermetallic compound; or a multiple-layered lamination of these.

13. A piezoelectric component according to claim 1, wherein a plurality of said device wirings sections are formed on a principle surface of said piezoelectric substrate, and all of said device wirings sections are arranged so as to have an equal electric potential.

14. A piezoelectric component according to claim 1, wherein said piezoelectric substrate is formed such that a ceramic material or crystalline material is laminated on a piezoelectric substrate composed of $LiTaO_3$, $LiNbO_3$, crystal, or on a substrate having a piezoelectric function that is formed a substrate, or on these piezoelectric substrates.

15. A piezoelectric component according to claim 1, wherein on an outer surface of said ceiling layer and said outer periphery wall layer, there is formed a film that is composed of an insulating material made with an organic material of a photosensitive polyimide, or a glass containing $SiO_2$, or that is composed of an insulating material such as a metal oxide film.

16. A piezoelectric component comprising:
   a piezoelectric substrate;
   a piezoelectric device formed on a principle surface of the piezoelectric substrate;
   a device wiring section formed on a principle surface of said piezoelectric substrate;
   a protective film that has a terminal electrode connected to the wiring section and is formed on an upper surface of said wiring section;
   a rewiring layer that is further formed on an upper surface of the protective film and is connected to a wiring section of an electrode, which is different from said electrode;
   a buffer layer that is composed of an inorganic material and that covers an entire upper surface of the rewiring layer excluding said piezoelectric device;
   an outer periphery wall layer that is composed of a photosensitive resin and is formed on an upper surface of the buffer layer;
   a ceiling layer that is composed of a photosensitive resin film having 10 to 45% by weight of a mica filler added thereto and that is formed on an upper surface of the outer periphery wall layer; and
   a through electrode that is formed so as to pass through said ceiling layer and said outer periphery wall layer; to thereby a hollow section that accommodates said piezoelectric device is formed between said outer periphery wall layer, said ceiling layer, and a principle surface of said piezoelectric substrate.

17. A manufacturing method of a piezoelectric component comprising:
   an aggregate piezoelectric substrate;
   a piezoelectric device formed on a principle surface of the aggregate piezoelectric substrate;
   a wiring section formed on said aggregate piezoelectric substrate;
   a through electrode that is formed on said aggregate piezoelectric substrate and is connected to the wiring section; and
   a hollow structure section that is provided so as to surround an upper surface of said piezoelectric device, said method including the steps of:
      laminating a photosensitive resin film on the principle surface of said aggregate piezoelectric substrate to thereby form an outer periphery wall layer that surrounds said piezoelectric device formed on the principle surface of said aggregate piezoelectric substrate;
      laminating a photosensitive resin film having a mica filler added thereto on an upper surface of the outer periphery wall layer to thereby form a first ceiling layer;
      installing a mesh-shaped member composed of an insulating material on an upper surface of the first ceiling layer; and
      laminating a photosensitive resin film having a mica filler added thereto on an upper surface of the installed mesh-shaped member to thereby form a second ceiling layer, and resin-ceiling said mesh-shaped member in between said first and second ceiling layers.

18. A manufacturing method of a piezoelectric component according to claim 17, wherein a dimension of a mesh of said mesh-shaped member is made greater than a diameter of said through electrode, and said through electrode is formed so as to pass through the mesh from a lower side when said through electrode is grown by means of electrolytic plating.

19. A manufacturing method of a piezoelectric component according to claim 17, wherein said through electrode is formed by means of electrolytic plating, embedding with use of molten solder, or embedding with use of a conductive paste.

20. A manufacturing method of a piezoelectric component according to claim 17, wherein said device wiring is such that all wirings are arranged so as to have an equal electric potential, and are formed by means of electrolytic plating when forming said through electrode.

* * * * *